(12) United States Patent
Tailliet

(10) Patent No.: US 6,580,594 B2
(45) Date of Patent: Jun. 17, 2003

(54) DEVICE FOR THE PROTECTION OF INTERCONNECTION LINES IN AN INTEGRATED CIRCUIT

(75) Inventor: Francois Tailliet, Le Tholonet (FR)

(73) Assignee: STMicroelectronics S.A., Gentilly (FR)

( * ) Notice: Subject to any disclaimer, the term of this patent is extended or adjusted under 35 U.S.C. 154(b) by 119 days.

(21) Appl. No.: 09/751,300

(22) Filed: Dec. 28, 2000

(65) Prior Publication Data

US 2001/0012191 A1 Aug. 9, 2001

(30) Foreign Application Priority Data

Dec. 28, 1999 (FR) .............................. 99 16604

(51) Int. Cl.$^7$ ................................................ H02H 3/22
(52) U.S. Cl. ......................... 361/111; 361/56; 257/296
(58) Field of Search ..................... 361/111.56; 257/296, 257/355, 356; 438/142, 387, 149

(56) References Cited

U.S. PATENT DOCUMENTS

| 5,457,336 A | | 10/1995 | Fang et al. ................. 257/322 |
| 5,497,146 A | * | 3/1996 | Hebiguchi .................. 257/452 |
| 5,515,226 A | | 5/1996 | Tailliet ........................ 361/56 |
| 5,668,032 A | * | 9/1997 | Holmberg et al. ............ 257/59 |
| 5,721,656 A | * | 2/1998 | Wu et al. .................... 257/355 |
| 5,953,191 A | | 9/1999 | Narita ........................ 361/56 |
| 5,973,658 A | * | 10/1999 | Kim et al. .................. 345/100 |
| 5,991,134 A | * | 11/1999 | Tan et al. ................... 257/355 |
| 6,385,021 B1 | * | 5/2002 | Takeda et al. .............. 361/111 |

FOREIGN PATENT DOCUMENTS

| EP | 0 614 223 A1 | 9/1994 | ......... H01L/27/115 |
| EP | 0 632 560 A2 | 1/1995 | ............ H02H/9/04 |
| EP | 0 693 781 A1 | 1/1996 | ........... H01L/27/02 |

OTHER PUBLICATIONS

Patent Abstracts of Japan for "Semiconductor Device and its Manufacturing Method"; publication # 10200077 published on Jul. 13, 1998; Inventor: Teramoto Shigeki.

* cited by examiner

Primary Examiner—Kim Huynh
(74) Attorney, Agent, or Firm—Lisa K. Jorgenson; Allen, Dyer, Doppelt, Milbrath & Gilchrist, P.A.

(57) ABSTRACT

The protection device for an interconnection line of an integrated circuit includes a charge flow-off device connected between the interconnection line to be protected and the substrate of the integrated circuit. The protection device also includes a dummy interconnection line ANT to activate the flow-off device. The protection device is active throughout the manufacture of the integrated circuit.

27 Claims, 6 Drawing Sheets

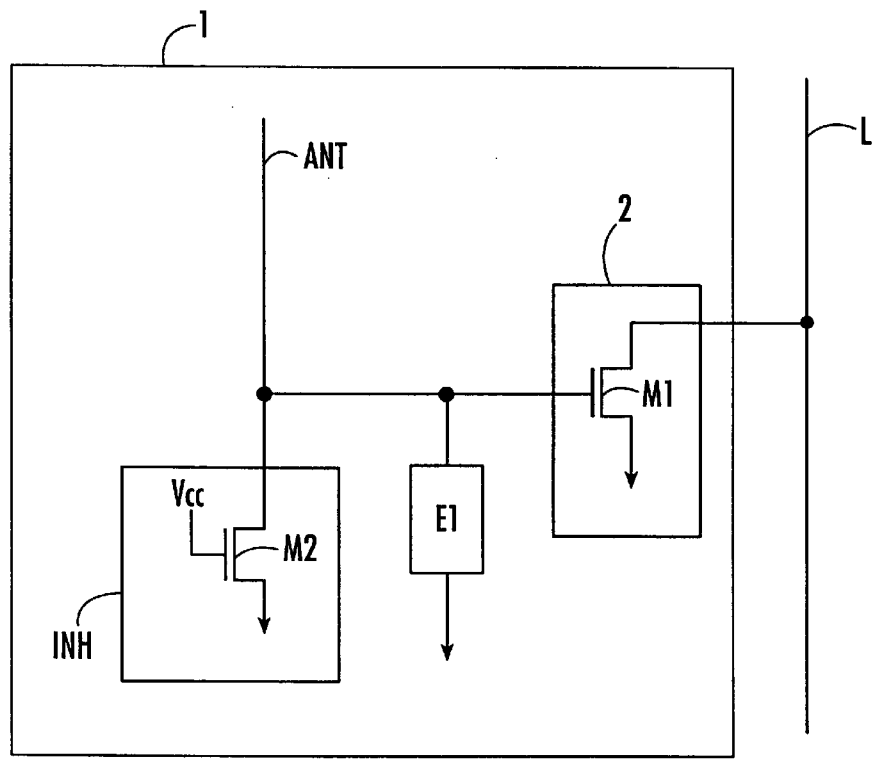
*FIG. 3.*
*FIG. 4.*
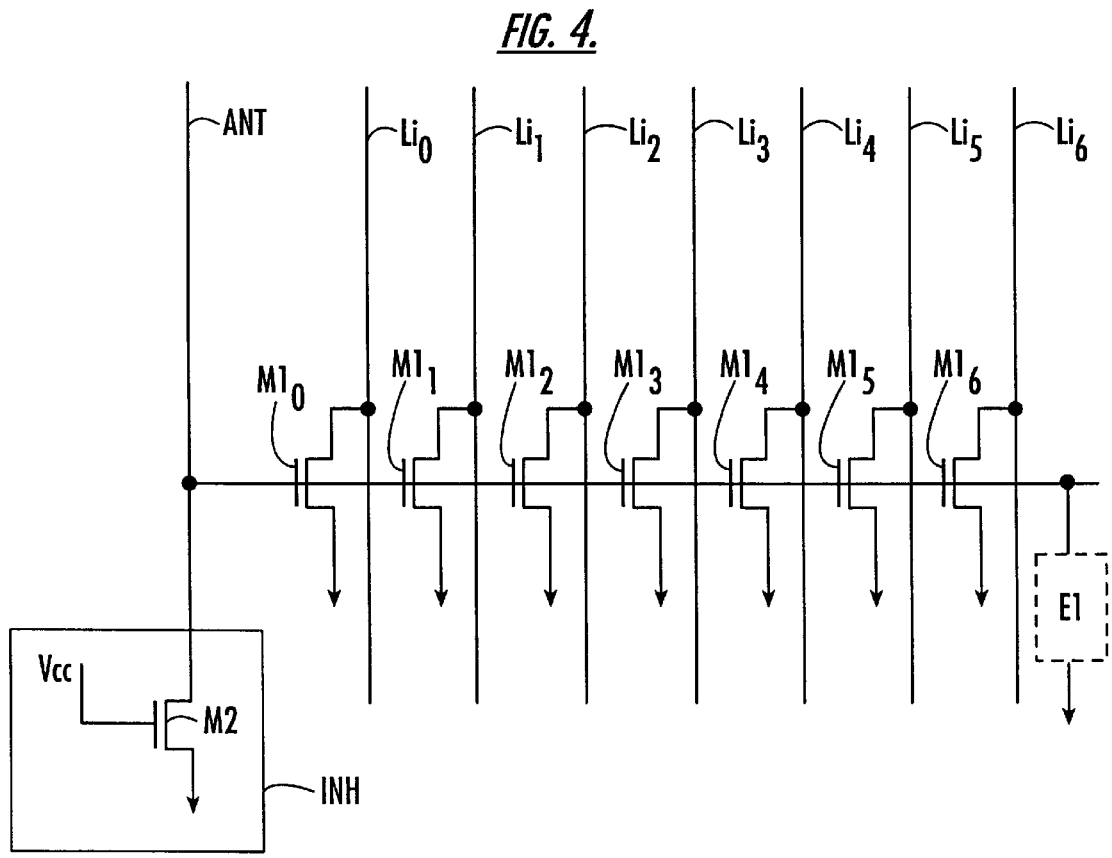

DEVICE FOR THE PROTECTION OF INTERCONNECTION LINES IN AN INTEGRATED CIRCUIT

FIELD OF THE INVENTION

The present invention relates to the field of integrated circuit manufacturing, and, more particularly, to interconnection line protection devices to protect elements connected to these lines against electrostatic charges generated during the manufacture of the integrated circuit. It is especially related to integrated circuits including MOS technology memories such as, for example, DRAM, NVRAM, EPROM, EEPROM or FLASH EPROM memories.

BACKGROUND OF THE INVENTION

In the usual memory architecture, which is the matrix architecture, each cell is controlled by a bit line and a word line of the memory. The bit lines and the word lines are driven by the outputs of a decoder. Each cell can thus be read or written individually through the selection of the corresponding bit line and word line by an address decoding circuit of the memory.

However, it is also common to provide for word access to the memory. The common memory architectures thus provide for the possibility of simultaneously accessing several bits, typically 8, 16 or 32 bits. In any case, the basic unit in terms of memory word is the byte formed by 8 bits. Memory architectures are thus based on bytes, the eight corresponding memory cells being located on the same word line. A simplified drawing of this matrix architecture of the memories is shown in FIG. 1. In an architecture of this kind, the bit lines Bl, which are driven by the column decoder DECX and contact the drains of the MOS transistors, are metal (aluminum) lines. The word lines Wl, which are driven by the row decoder DECY and contact the gates of MOS transistors, are polysilicon lines. These interconnection lines travel throughout the memory array, longitudinally (0y) for the bit lines and horizontally (0x) for the word lines.

In this architecture, a byte is formed by eight cells located on one and the same word line Wl, at the intersection of eight consecutive bit lines. The usual EEPROM memory architectures also have source lines, made of metal, that contact the source diffusions of the memory cells to draw these sources to ground, generally in read mode. These source lines travel through the memory array longitudinally. They are commonly made of metal. They are connected peripherally to the memory array of a ground connection transistor controlled by a control signal as a function of the mode of access to the memory.

To enable the simultaneous selection of all the bits of a word on a word line and only these bits, a grouping of bit lines and columns is combined with the matrix organization. This enables simultaneous access to several cells, typically eight cells, forming a memory word (byte). An architecture of this kind calls for additional transistors each enabling the selection of a particular column of the memory. In this case, there is provided one control line per column, namely per group of eight bit lines, with one column selection transistor per word line. These control lines also run through the memory array longitudinally. They are usually made of metal.

In the case of a matrix architecture of this kind with columnwise grouping, one source line is generally provided for two columns. This source line connects the sources of the floating-gate transistors of the memory cells of these two columns to a corresponding ground connection transistor. The number of these ground connection transistors typically depends on the memory architecture chosen by the designer, in line with the application constraints and the design and drawing rules.

Thus, an EEPROM memory array usually includes, as interconnection lines running throughout the memory array (in one dimension of the array), bit lines, word lines, control lines and source lines. FIG. 2 shows two columns of a corresponding EEPROM memory array. This example shows the cells of two consecutive columns located on one and the same word line $Wl_k$. It will be recalled that an EEPROM memory cell usually includes (at least) one access transistor Ta series-connected with a floating-gate transistor Tf. The access transistor is connected at its gate to the corresponding word line and at its drain to the corresponding bit line.

In the example, the first column Col1 has eight cells C0 to C7 placed on the word line $Wl_k$. The first cell C0 is connected to the bit line Bl0, the second cell C1 is connected to the bit line Bl1 and so on and so forth up to the last cell C7 which is connected to the bit line Bl7. All the floating-gate transistors of these cells C0 to C7 have a common source diffusion connected to the source line associated with the column, $LS_i$. A column selection transistor $TC_{k,i}$ is connected between the control line $CG_i$ associated with the column and the common gate of the floating-gate transistors of the cells C0 to C7.

The second column Col2 has an identical structure. In the example, it is made in the memory array in a symmetrical way. Thus, from left to right, there is the source line $LS_i$ of the first column, the eight bit lines Bl0 to Bl7, the control line $CG_i$ of the first column, the control line $CG_{i+1}$ of the second column, eight bit lines Bl0 to Bl7 and the source line $LS_{i+1}$ of this second column.

The problem that arises with such memory architectures lies in the different interconnection lines that run throughout the memory array in at least one direction of this array, Ox or Oy, and are connected to the cells. Indeed, it is well known that certain steps in the manufacture of an integrated circuit give rise to electrostatic charges that are collected by the interconnection lines forming an antenna. This may lead to an increase in potential at these lines that affects the elements connected thereto. In the example of the interconnection lines of a memory, the cells of this memory may be affected. Indeed, the increase in potential at the constituent elements of the memory cells may have different harmful effects.

A first harmful effect is the damaging or destruction of active elements of these cells: junctions, gate oxide, tunnel oxide, leading to leakages of these elements (junctions, gate oxide) or even breakdown (tunnel oxide). These harmful effects are generally found in any integrated circuit having interconnection lines connected to electronic elements. Another harmful effect is the reduction of the life cycle of the memory cell. The substantial increase in potentials on these lines due to the electrostatic charges may have the same effect as a large number of read and/or write access operations and may correspondingly reduce the lifetime guaranteed for these cells.

The manufacturing steps that raise these problems include, for example, the step of plasma etching of the polysilicon layers and of metallization and the steps for cleaning the wafers by gas flux or by liquid. In the plasma-etching step, the wafer is subjected to ion bombardment which may lead to an increase in the surface potential.

Special precautions are usually taken to prevent this increase in potential, especially the application of a magnetic field in the etching chamber. However, these precautions prove to be insufficient in practice.

In the wafer-cleaning steps, the friction of the cleaning fluid may give rise to electrostatic charges, by triboelectricity. The prior art method of using a conductive fluid does not satisfactorily resolve this problem.

In certain integrated circuits, passive devices are also used. These are typically diodes connected between the interconnections and the substrate to limit the voltage incursion on these lines. The incursion is thus limited to the interconnection lines either by placing the diode in a forward connection with a limitation, in absolute value, to 0.6 volts or by placing the diode in an avalanche connection with a limitation, in absolute value, to 15 volts (typical values). However, these devices are not satisfactory, especially because they cannot be used for interconnection lines that have to receive high potentials in operational mode, namely potentials above the thresholds of the diodes, such as the interconnection lines of a memory array, for the programming of the cells.

SUMMARY OF THE INVENTION

Thus, an aim of the invention is to resolve the problem of electrostatic charges on the interconnection lines of an integrated circuit. This problem arises throughout the process of manufacturing the integrated circuit once the interconnection lines and their connections to elements of the integrated circuit have been made.

The approach used to resolve this problem is not to prevent these charges, as in the prior art, but to find a way of making the charges that might be generated during the manufacture of the integrated circuit flow away without damaging any of the elements connected to these interconnection lines.

The basic idea of the invention is a protection device that is active throughout the manufacture of an integrated circuit to protect an interconnection line.

The invention also relates to a device for the protection of an interconnection line of an integrated circuit, including a charge flow-off device connected to the interconnection line to be protected and a dummy interconnection line to activate the flow-off device, the protection device being active throughout the manufacture of the integrated circuit.

In practice, it is possible to provide for one and the same dummy interconnection line connected to several flow-off devices used for the protection of a set of interconnection lines. To obtain high efficiency, one and the same dummy interconnection line is connected to a limited number of flow-off devices so as not to damage the sensitivity of the dummy interconnection line.

In the exemplary application to a memory integrated circuit, it is possible especially to place dummy interconnection lines in the memory array to protect the different interconnection lines designed in the memory array to access the cells.

BRIEF DESCRIPTION OF THE DRAWINGS

Other features and advantages of the invention are described in detail in the following description of different embodiments, given by way of a non-restrictive indication, with reference to the appended figures, of which:

FIG. 3 is a schematic diagram illustrating a device for the protection of an interconnection line in accordance with the present invention.

FIG. 4 is a schematic diagram illustrating an alternative embodiment of a protection device according to the invention for a set of interconnection lines.

DETAILED DESCRIPTION OF THE PREFERRED EMBODIMENTS

Figure 1:
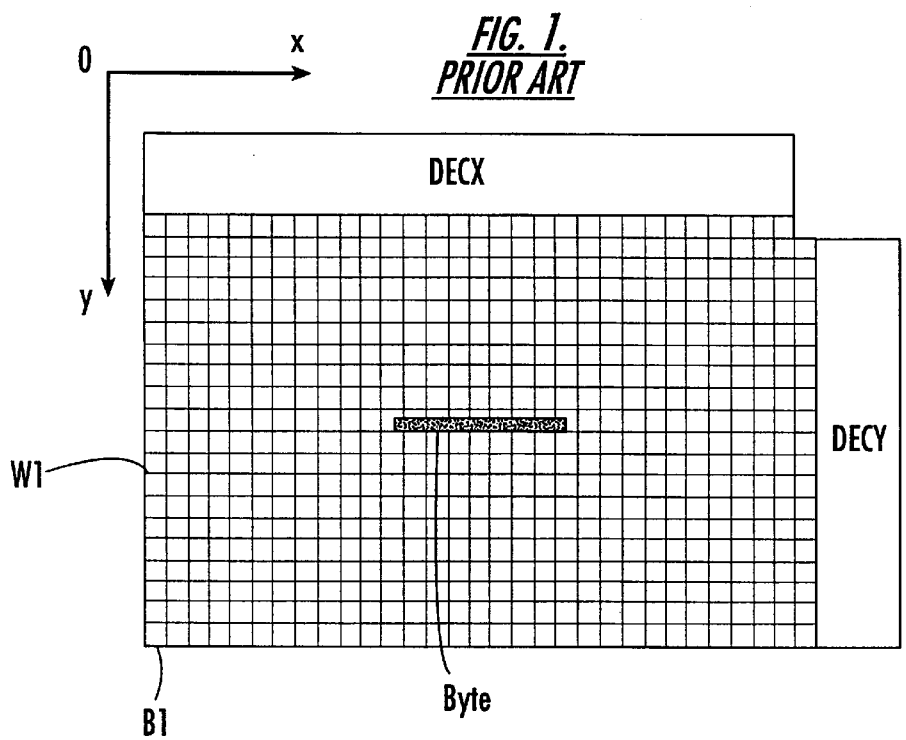
FIG. 1, already described, is a schematic diagram of memory array.

FIG. 3 shows a protection device 1 according to the invention for an interconnection line Li. This protection device 1 includes a device 2 for the flow-off of charges towards the substrate of the integrated circuit and a dummy interconnection line ANT to activate the charge flow-off device. In the example, the charge flow-off device 2 comprises an N type MOS transistor M1 connected between the interconnection line Li to be protected and the substrate, which is schematically represented by an arrow pointing downwards. This MOS transistor M1 is controlled at its gate by the dummy interconnection line ANT.

The principle on which the protection device is based is that if electrostatic charges appear on the interconnection line Li to be protected, due to the manufacturing step being performed at the time, they also appear on the dummy line ANT (and vice versa). The appearance of charges on the dummy line ANT leads to an increase in the potential at the gate of transistor M1 (the gate capacitor gets charged). When the voltage at the gate becomes excessively high, this transistor turns on. It then provides a passage towards the substrate for the electrostatic charges that might appear on the protected interconnection line Li. This transistor M1 is sized to withstand the current induced by the quantity of electrostatic charges that have to be made to flow off.

The protection device has to fulfill its function during the manufacture of the integrated circuit whereas it will be noted that the integrated circuit is not powered. At this time, the substrate is therefore not biased. The protection device according to the invention is thus an active device that draws its energy from the electrostatic charges themselves.

In one improvement, the protection device furthermore comprises a limiter E1 to limit the voltage on the dummy interconnection line. Indeed, the voltage at the gate of the transistor M1 remains lower than the gate oxide breakdown voltage. This limiter will be sized for example to get activated towards 15 volts. For the practical embodiment of this limiter, the devices used will be similar to those used to protect the input pads of the integrated circuits against electrostatic discharges but, in addition, they will be small-sized, the quantity of electrostatic charges being smaller in the field of the invention. This limiter will be made, for example, by conventionally using a lateral bipolar transistor or a simple diode.

In the example shown in FIG. 3, the protection device furthermore comprises a disabling device INH to deactivate the protection device when the integrated circuit is powered on. Indeed, in operational mode, certain interconnection lines may be brought to high potentials such as, for example, a memory cell programming potential. The protection device associated with these interconnection lines should not get activated in operational mode. Hence, at least for the interconnection lines that have to receive high potentials in the operational mode of the integrated circuit, a disabling device of this kind is provided. This disabling device is formed in a simple way by an N type MOS transistor M2 whose gate is connected to the logic supply voltage of the integrated circuit to draw the dummy interconnection line to the bias voltage of the substrate as soon as the integrated circuit is powered on. Thus, the charge flow-off device can no longer be activated in the operational mode of the integrated circuit. If the MOS transistor M2 is chosen to be a P type transistor, its gate will be connected to the electrical ground of the integrated circuit.

The transistor M2 of the disabling device may furthermore fulfill the function of the limiter E1, especially because of the structure of the parasitic lateral bipolar transistor inherent in the structure of the MOS transistor. Thus, should the protection device associated with an interconnection line comprise a disabling device of this kind, there will be no need to provide, in addition, for a limiter. This will mean a saving of surface area in the integrated circuit.

FIG. 4 shows an application of the protection device according to the invention to a group of interconnection lines $Li_0$ to $Li_6$. It comprises an antenna ANT, a disabling device INH and/or a limiter E1 (shown in dashes) and as many detection devices $M1_0$, . . . , $M1_6$ as there are interconnection lines $Li_0$ to $Li_6$ to be protected. Thus, the protection device according to the invention is used to protect one or more interconnection lines by a dummy interconnection line. It works as soon as this line and the associated flow-off devices are made. It can be deactivated after the manufacture of the integrated circuit by the disabling device INH, designed for this purpose, by the powering-on of the integrated circuit.

In practice, the dummy interconnection line ANT is made in the vicinity of the interconnection line or lines to be protected, for optimum efficiency. Indeed, if the dummy line is at too great a distance from the line to be protected, the associated flow-off device could get activated far too late. In FIGS. 3 and 4, the dummy interconnection line is parallel to the interconnection line that it protects. This seems to be the most efficient embodiment once the dummy line can be made in the vicinity of these lines. However, in certain integrated circuits structures, it may be planned that the dummy line will not follow the same direction as the line that it protects. Thus, the implementation of the invention assumes that the desired efficiency of protection and the increase in surface area required to lay out these devices will be taken into account.

In one application to the protection of interconnection lines of a memory, the existing symmetries in the layout diagram of the memory are used to optimize the protection according to the invention. The exemplary applications of the protection device according to the invention given here below are applicable to memories in general, for the protection of the interconnection lines used to access the cells (read, write, refreshing, and other types of access).

Figure 5A:
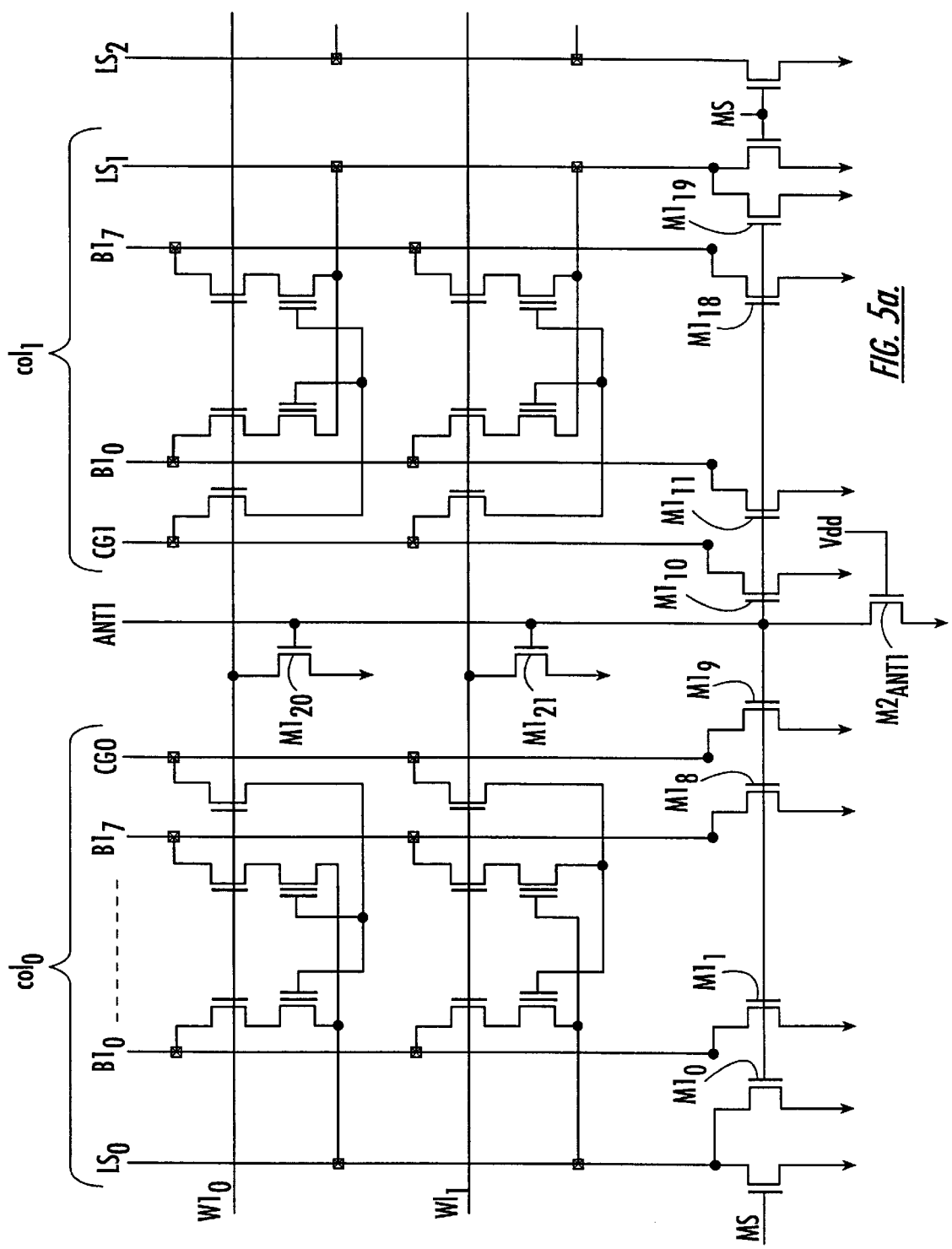
FIGS. 5a and 5b are schematic diagrams illustrating examples of the protection device according to the invention for the protection of interconnection lines in a memory array.

FIG. 5a thus shows an exemplary known architecture of an EEPROM memory in which protection devices according to the invention have been integrated. In a memory array of this kind, it has been seen that the interconnection lines to be protected are, firstly, the bit lines, the control lines and the source lines that run through the memory array in the direction Ox of the memory array (namely longitudinally) and secondly the word lines that run through the memory array in a direction Oy (namely horizontally).

Figure 2:
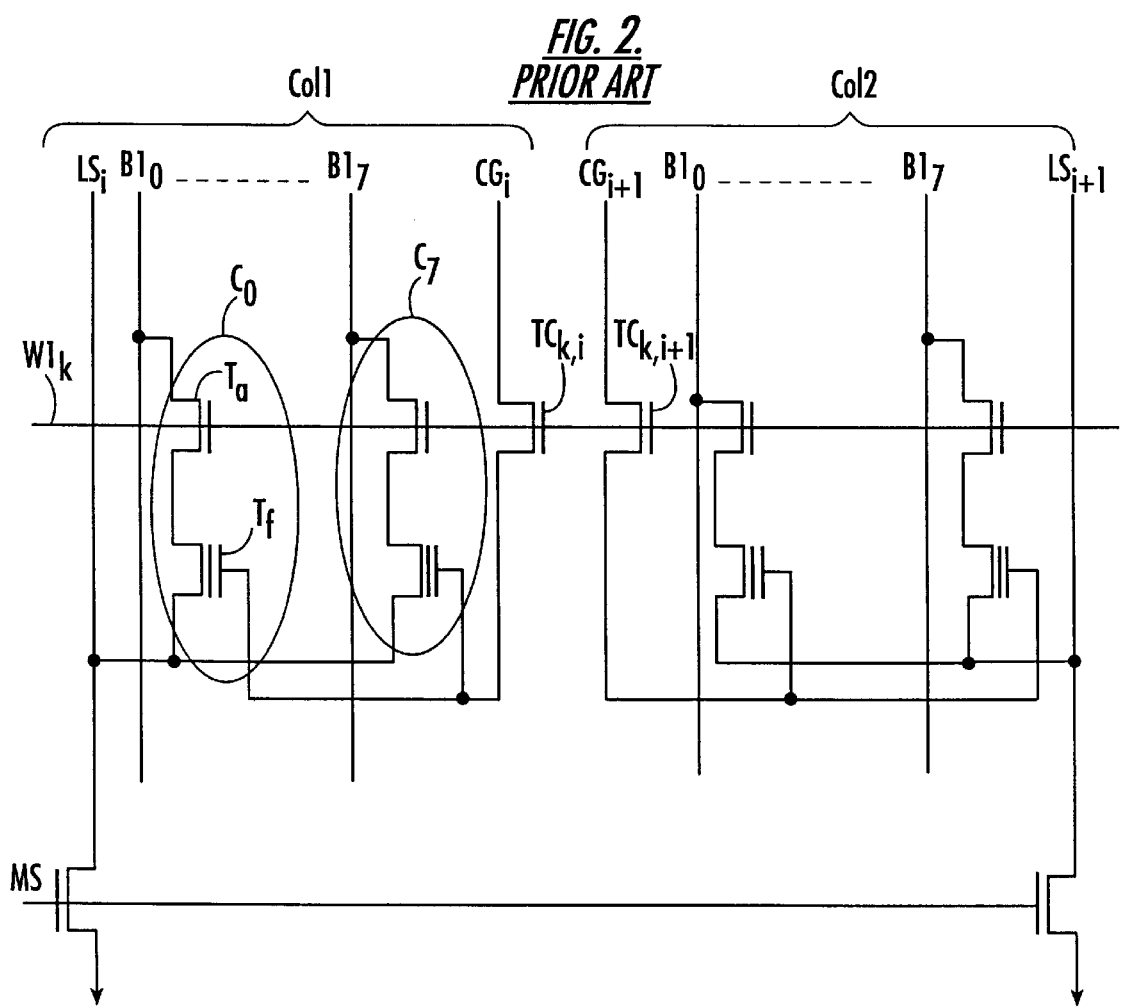
FIG. 2, already described, is a more detailed schematic diagram of two successive bytes in an EEPROM type memory array.

We have already described an exemplary structure of an EEPROM memory array (FIG. 2). In this example, there is one control line and one source line per group of eight bit lines. FIG. 5a shows two successive columns of a memory array of this kind. Thus, FIG. 5a shows, from left to right, a first source line LS0, then eight bit lines Bl7 to Bl0 and then a control line CG0, these lines forming the first column Col0 of the memory. Then, the next control line CG1, eight bit lines Bl7 to Bl0, and then the following source line LS1, these lines forming the second column Col1 of the memory, and then the sequence is resumed with the following bit line LS2 and so on and so forth for the columns that follow. Thus, in this architecture, there is an axis of symmetry in each pair of successive columns, between the two control lines.

In this architecture, it is thus possible to efficiently protect the bit, control and source lines of two successive columns by a single dummy line ANT1, placed between two control lines that follow each other, CG0 and CG1 in the example as shown in FIG. 5a. The corresponding protection devices and the disabling device are placed preferably on the periphery of the memory, in the example at the bottom. Thus, there is one flow device per interconnection line protected by the dummy line ANT1, giving, in the example, 20 transistors $M1_0$ to $M1_{19}$, to respectively protect the line LS0, eight bit lines, the line CG0, the line CG1, eight bit lines and the line LS1. The disabling transistor $M2_{ANT1}$ is connected between the dummy line ANT1 and the integrated circuit substrate. If in addition a limiter E1 is planned, it is connected between the dummy line and the substrate.

With regard to the word lines, it is possible to use the previous dummy lines ANT1 to protect them, as shown in FIG. 5a. It is thus possible to plan that an antenna ANT1 will furthermore protect 16 word lines. Thus, in a memory array having 512 bit lines by 512 word lines, there will be 32 dummy lines ANT1, each protecting 16 bit lines and the associated control and source lines and 16 word lines. In this case, a flow device is placed at the intersection of the associated word line and dummy line. In the example shown (FIG. 5a), the flow device thus comprises a transistor $M1_{20}$ connected between the word line Wl0 and the substrate and a transistor $M1_{21}$ connected between the word line Wl1 and the substrate. Preferably, as shown in FIG. 5b, to protect the word lines, provision is made for dummy lines different from those used for the bit, control and source lines.

Figure 5B:
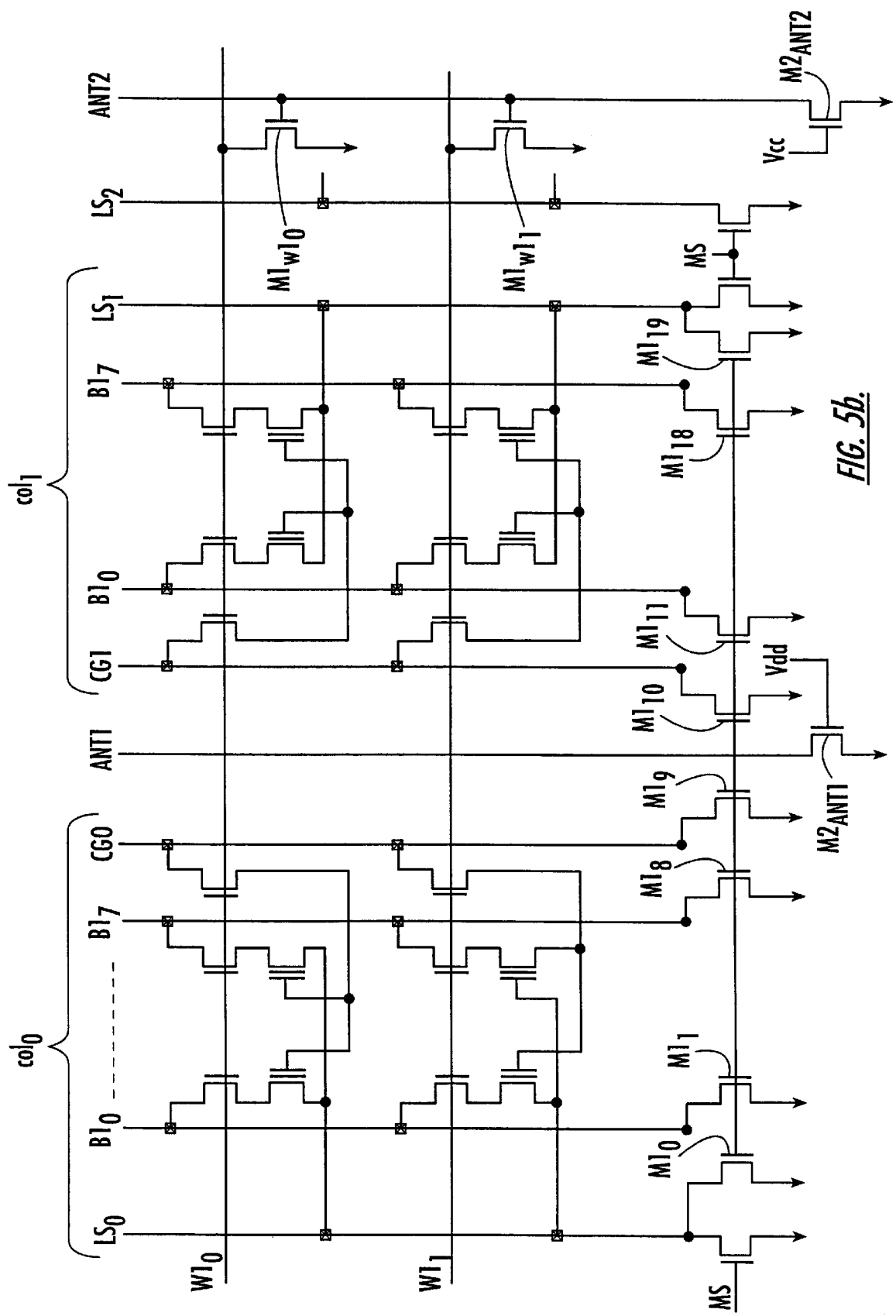

In a first corresponding exemplary embodiment shown in FIG. 5b, one and the same dummy line ANT2 is thus used to protect the word lines. In this example, this dummy line ANT2 is made at the end of a memory array, in parallel to the bit lines, with one flow-off device per word line, placed at the end of this word line. In this case, each flow-off device is placed at the intersection of the associated word line and the dummy line ANT2. FIG. 5b thus shows a first flow-off transistor $M1_{Wl0}$ connected between the word line Wl0 and the substrate and having its gate connected to the dummy line ANT2 and a second transistor $M1_{Wl1}$ connected between the word line Wl1 and the substrate and having its gate connected to the dummy line ANT2. The corresponding disabling device $M2_{ANT2}$ is placed at the end of the dummy line.

In practice, the number of bit lines protected by a single antenna is limited by the loss of sensitivity of the antenna due to the equivalent capacitive charge of the gates of the transistors of the flow-off devices.

Figure 6:
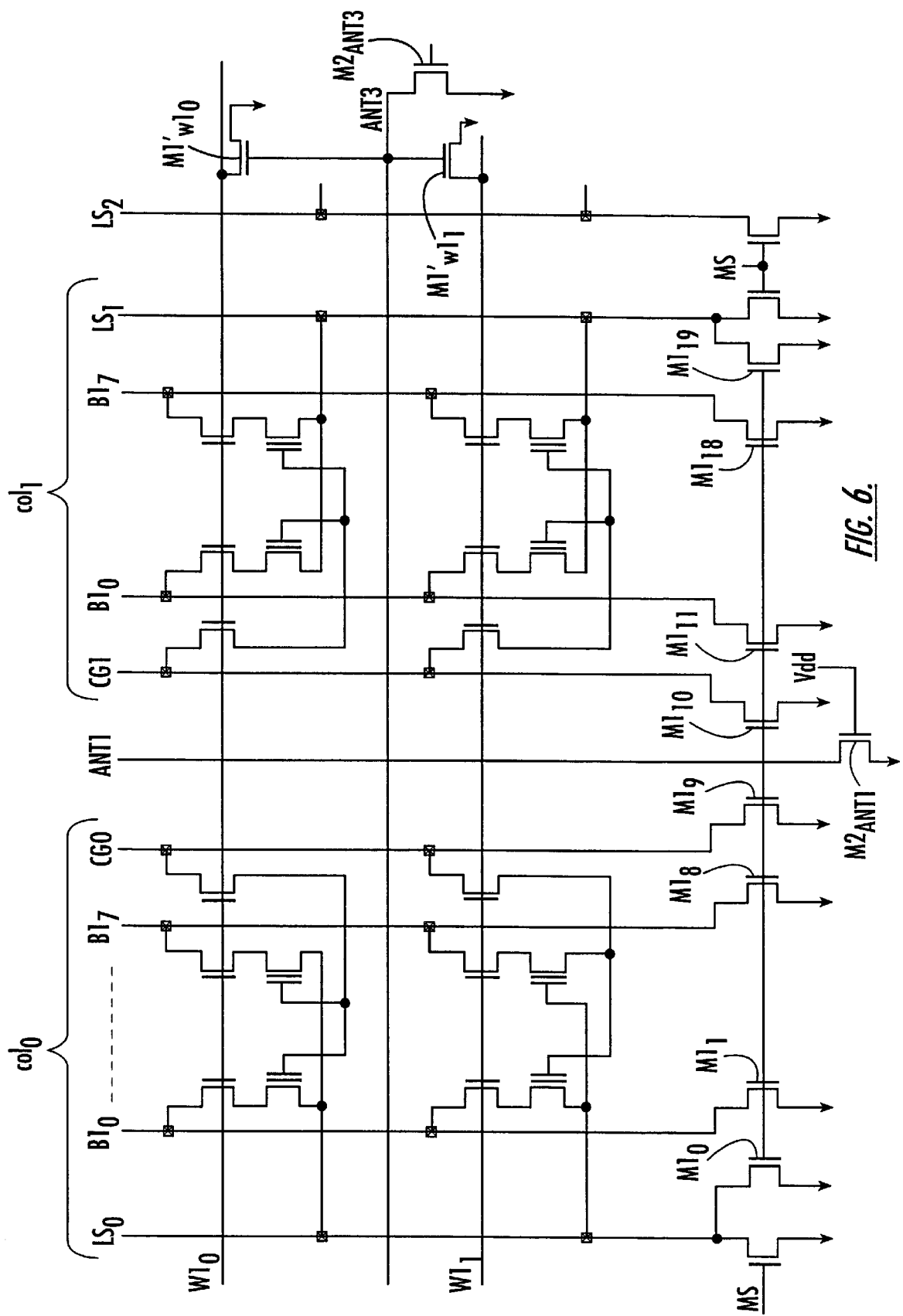
FIG. 6 is a schematic diagram illustrating another embodiment of the dummy lines associated with the word lines.

FIG. 6 shows another embodiment of the dummy lines associated with the word lines. In this example, a dummy line ANT3 is placed between two successive word lines Wl0 and Wl1. This dummy line is therefore parallel to these lines. Thus, there is one dummy line for two successive word lines of the memory array. This embodiment is highly efficient but very costly since, for a memory array with 512 word lines, it requires the making of 251 dummy lines. In this example, the flow-off devices and the disabling devices are placed on the periphery of the memory array. FIG. 6 thus shows a first flow-off transistor $M1'_{W10}$ connected between the word line Wl0 and the substrate, and having its gate connected to the dummy line ANT3, and a second transistor $M1'_{W11}$ connected between the word line Wl1 and the substrate and having its gate connected to the dummy line ANT3. The corresponding disabling device $M2_{ANT3}$ is placed at the end of the dummy line ANT3.

There are many other exemplary embodiments, with varying degrees of efficiency and varying degrees of cost in terms of space. The choice of one embodiment or another depends in practice on the constraints related to the application concerned.

However, another consideration, relating to the manufacture of the protection device, is that it takes account of the implementation of the invention. Indeed, for the protection device associated with one or more bit lines to become effective as soon as these lines are made, the protection device should be made, at the latest, during the step for manufacturing the lines that it protects.

Now, all the interconnection lines of an integrated circuit are not made out of the same material. In the example of the EEPROM memory, the word lines are polysilicon while the bits lines, source lines and control lines are made of metal. Now the polysilicon layers are made before the metal layers. If we take the exemplary embodiment shown in FIG. 5a, if the antenna ANT1 is made of metal and used as a dummy line for the word line Wl1 and Wl0 (cases shown with the associated flow-off transistors $M1_{20}$ and $M1_{21}$), the polysilicon lines are not protected between the step of etching the polysilicon during which they are made and the step of etching the metal when the dummy line is made. Thus, it is preferable that the interconnection lines to be protected and the associated dummy lines should form homogeneous sets.

Figure 7A:
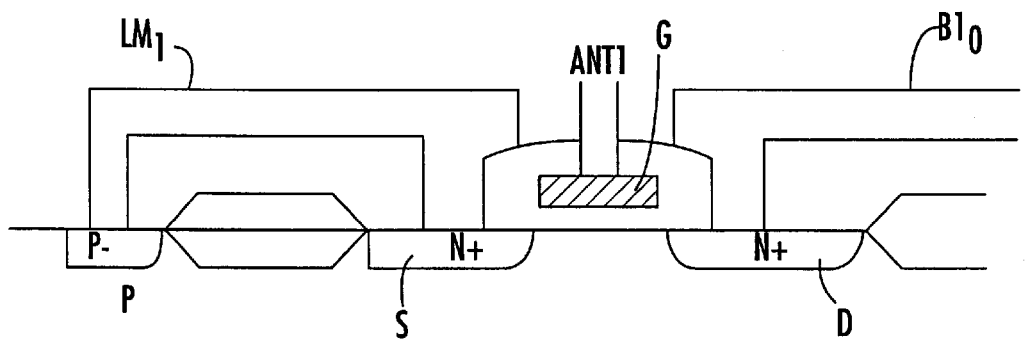
FIGS. 7a and 7b are cross-sectional views illustrating a MOS transistor for use in a protection device according to the invention.

It is thus planned to protect the bit, control and source lines which are made of metal by dummy lines made of metal. This does not raise any particular difficulties of manufacture since, to make the totality of the protection device or devices (dummy lines, transistors, limiter diodes), standard techniques and technologies are used. FIG. 7a thus shows a sectional view of a MOS transistor that can be used as a transistor in the flow-off devices or in the disabling devices. In the example, the source diffusion S of the transistor is connected by a metal line LM1 to a substrate contact (P⁻ diffusion in the example). The drain diffusion D is connected by a metal line which may be a bit line Bl0. The polysilicon gate is connected to a metal line which, in the example, is a dummy line ANT1. Thus, when the step of etching the metal is terminated, the protection device is operational to protect lines that are made in this same step. We then have optimum protection efficiency for these lines.

In the case of technologies with a double level of metal, referenced Metal1 and Metal2, it is planned to make the dummy lines preferably on the same level of metal as the lines that it protects. If for example the bit lines are made of Metal1 and the source and control lines are made of Metal2, it is then planned to duplicate the dummy line ANT1, and make one dummy line $ANT1_{M1}$ out of Metal1, to protect the bit lines as soon as they are manufactured, and one dummy line $ANT1_{M2}$ out of in Metal2, to protect the control and source lines, the two dummy lines using the same flow-off and disabling devices. It is enough, for example, to short-circuit these two dummy lines as shown in a cross-sectional view in FIG. 7b which shows the two levels of metal of the dummy line $ANT1_{M1}$ and $ANT_{M2}$, and their connections on the gate G of one and the same flow-off transistor.

More generally, in a way that is not limited to the metal levels, when interconnection lines are made out of the same material but at different levels in the integrated circuit, it may be planned to split up the dummy lines made out of this material to obtain several lines made of this material, one on top of the other, short-circuited to share the same flow-off devices. Thus, as and when the different levels are made, there is always an optimum efficiency of protection.

Figure 7B:
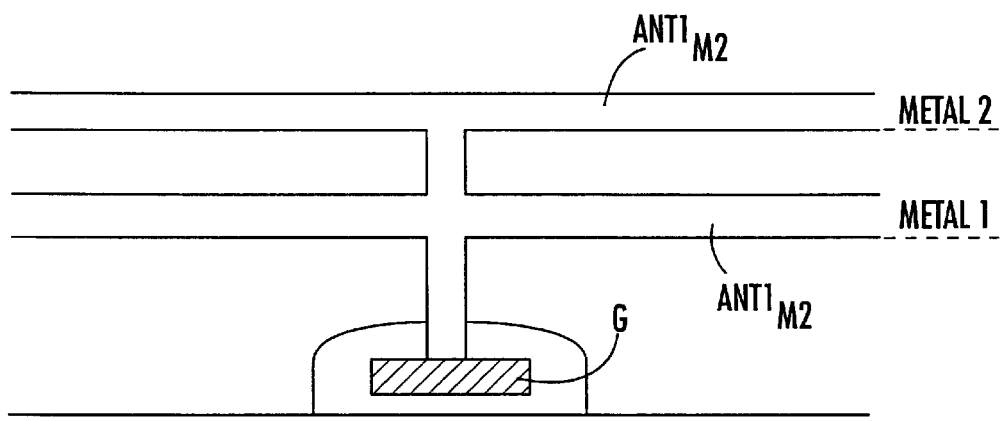
Figure 8:
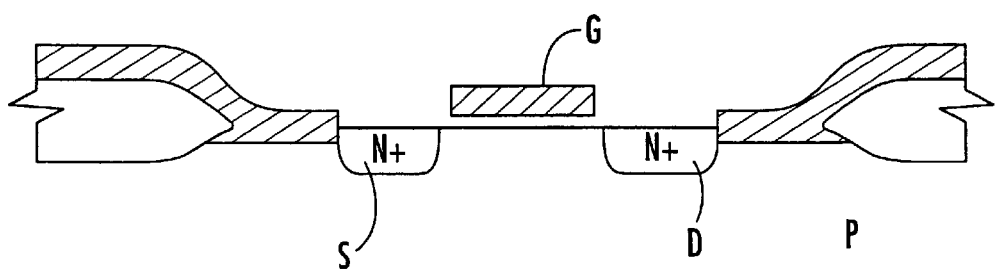
FIG. 8 is a cross-sectional view of a MOS transistor in which the contacts are made of polysilicon, which can be used in a protection device according to the invention.

In the exemplary EEPROM memory, the word lines are made of polysilicon. It is therefore planned preferably to make associated dummy lines also out of polysilicon. However, this is not enough to make the protection device operational as soon as the corresponding step of manufacture is completed. Indeed, the contacts on the transistors are usually made of metal as shown in FIGS. 7a and 7b. In the present case, these contacts must be made differently so that the connections are operational as soon as the manufacturing step, namely the step of etching the polysilicon, is considered to be complete. FIG. 8 shows a well-known connection technique, known as a buried contact technique, which may be used.

In this technique, the contact of the sources and drains is made by polysilicon lines. The contact is made by the edge of the drain (or the source), with the polysilicon deposited on the surface of the substrate, the annealing of the polysilicon giving rise to the formation of a diode between the polysilicon and the substrate by diffusion of the polysilicon doping in the substrate.

By using this technique to make at least the charge flow-off transistors associated with the polysilicon dummy lines, the protection device is operational as soon as the polysilicon etching step is performed. It is not necessary to use this technique for the disabling transistors because the transistors need to be operational only when the integrated circuit has been finished and powered on. It is therefore possible to use standard MOS transistors that cost less in terms of space requirement.

It will be noted that, in certain memory architectures, it is possible to have several polysilicon levels. The dummy lines can then be increased in number as indicated here above. The buried contact connection technique can be used especially in the exemplary embodiments described, with the dummy line ANT2 (FIG. 5b) and the dummy line ANT3 (FIG. 6). Other alternative embodiments are possible, depending on the technology and the architecture of the integrated circuit considered. All these alternatives are within the scope of the invention. In particular, the invention is not limited to an application to memory arrays. It can be applied more generally to any integrated circuit comprising interconnection lines of electronic elements.

That what is claimed is:

1. A device for the protection of at least one interconnection line of an integrated circuit during the manufacture of the integrated circuit, the device comprising:

at least one line protection device connected between the interconnection line and a substrate of the integrated circuit; and a dummy interconnection line connected to the at least one line protection device for activating the line protection device with an electrostatic charge during the manufacture of the integrated circuit.

2. A protection device according to claim 1, wherein said dummy interconnection line is common to a set of interconnection lines to be protected, and wherein a line protection device is connected between each of the lines to be protected and the substrate.

3. A protection device according to claim 2, wherein said set of interconnection lines and the associated dummy line are made out of the same material.

4. A protection device according to claim 1, wherein the at least one interconnection line and the dummy line are formed during a same manufacturing step.

5. A protection device according to claim 4, wherein the dummy interconnection line is a multi-level dummy interconnection line.

6. A protection device according to claim 1, further comprising a disabling circuit connected between the dummy interconnection line and the substrate, and wherein the disabling circuit is activated to inhibit activation of the at least one line protection device by a powering on of the integrated circuit.

7. A protection device according to claim 1, further comprising a voltage limiter connected between the dummy interconnection line and the substrate.

8. A protection device according to claim 1, wherein the integrated circuit comprises a memory array.

9. An integrated circuit memory array comprising:

a plurality of memory cells;

interconnection lines connected to the memory cells; and at least one protection device for the protection of at least one interconnection line during the manufacture of the memory array and comprising at least one line protection device connected between at least one interconnection line and a substrate of the integrated circuit memory array, and a dummy interconnection line connected to the at least one line protection device for activating the line protection device with an electrostatic charge during the manufacture of the memory array.

10. A memory array according to claim 9, wherein the interconnection lines are organized in a matrix form according to a column architecture where a column comprises bit lines, one source line and one control line;

and wherein the protection device is used to protect the bit lines, the source line and the control line of at least one column;

the at least one protection device comprising a dummy line and a line protection device per protected interconnection line.

11. A memory array according to claim 10, wherein the protection device is used to protect the bit lines, the source line and the control line of two successive columns; and wherein the dummy interconnection line is between the two columns to protect the corresponding interconnection lines.

12. A memory array according to claim wherein the interconnection lines further comprise word lines; and wherein the protection device for the bit lines, source lines and control lines further comprises a line protection device to protect each word line of the memory array.

13. A memory array according to claim 10, wherein the bit lines, control line, source line, and dummy interconnection line are made of metal.

14. A memory array according to claim 13, wherein said dummy interconnection line is a multi-level dummy interconnection line.

15. A memory array according to claim 9, wherein the interconnection lines comprise word lines;

wherein the at least one protection device comprises a protection device for at least two successive word lines; and wherein the protection device comprises one dummy interconnection line between the two successive word lines.

16. A memory array according to claim 15, wherein the at least one protection device comprises a protection device for all the word lines of the memory array; and wherein the protection device comprising a dummy interconnection line at an end of the memory array.

17. A memory array according to claim 15, wherein the word lines and the corresponding dummy interconnection line are made of polysilicon.

18. A memory array according to claim 9, wherein the line protection devices are on a periphery of the memory array.

19. A memory array according to claim 9, wherein each of the protection devices comprises a disabling device connected to its dummy interconnection line to inhibit activation of the protection device by a powering on of the integrated circuit; and wherein the disabling device is on the periphery of the memory array.

20. A method for protecting at least one interconnection line of an integrated circuit during the manufacture of the integrated circuit, the method comprising:

connecting at least one line protection device between the interconnection line and a substrate of the integrated circuit; and connecting a dummy interconnection line to the at least one line protection device for activating the line protection device with an electrostatic charge during the manufacture of the integrated circuit.

21. A method according to claim 20, wherein said dummy interconnection line is common to a set of interconnection lines to be protected, and wherein a line protection device is connected between each of the lines to be protected and the substrate.

22. A method according to claim 21, wherein the set of interconnection lines and the associated dummy line are made out of the same material.

23. A method according to claim 20, wherein the at least one interconnection line and the dummy line are formed during a same manufacturing step.

24. A method according to claim 23, wherein the dummy interconnection line is a multi-level dummy interconnection line.

25. A method according to claim 20, further comprising connecting a disabling circuit between the dummy interconnection line and the substrate, and wherein the disabling circuit is activated to inhibit activation of the at least one line protection device by a powering on of the integrated circuit.

26. A method according to claim 20, further comprising connecting a voltage limiter between the dummy interconnection line and the substrate.

27. A method according to claim 20, wherein the integrated circuit comprises a memory array.

* * * * *